United States Patent
Tsukahara et al.

(10) Patent No.: US 12,463,147 B2
(45) Date of Patent: Nov. 4, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Yoshihiro Tsukahara, Tokyo (JP); Makoto Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 720 days.

(21) Appl. No.: 17/758,481

(22) PCT Filed: May 22, 2020

(86) PCT No.: PCT/JP2020/020392
§ 371 (c)(1),
(2) Date: Jul. 7, 2022

(87) PCT Pub. No.: WO2021/234969
PCT Pub. Date: Nov. 25, 2021

(65) Prior Publication Data
US 2023/0026891 A1    Jan. 26, 2023

(51) Int. Cl.
*H01L 21/56* (2006.01)
*H01L 23/00* (2006.01)
(Continued)

(52) U.S. Cl.
CPC ............ *H01L 23/552* (2013.01); *H01L 21/56* (2013.01); *H01L 23/13* (2013.01);
(Continued)

(58) Field of Classification Search
CPC ..... H01L 21/56; H01L 23/13; H01L 23/3121; H01L 23/5383; H01L 24/48; H01L 25/0655; H01L 25/50
See application file for complete search history.

(56) References Cited

U.S. PATENT DOCUMENTS

| | | |
|---|---|---|
| 2018/0182715 A1 | 6/2018 | Kim et al. |
| 2020/0126896 A1 | 4/2020 | Yoshioka et al. |
| 2023/0026891 A1* | 1/2023 | Tsukahara ................ H05K 9/00 |

FOREIGN PATENT DOCUMENTS

| | | |
|---|---|---|
| JP | 2005-340656 A | 12/2005 |
| JP | 6180646 B1 | 7/2017 |
| JP | 2018-107408 A | 7/2018 |

OTHER PUBLICATIONS

International Search Report issued in PCT/JP2020/020392; mailed Jul. 7, 2020.

\* cited by examiner

*Primary Examiner* — Mark V Prenty
(74) *Attorney, Agent, or Firm* — Studebaker Brackett PLLC (57) ABSTRACT

A semiconductor device includes a multi-layer board which a wiring pattern and a grounding pattern are formed. A plurality of semiconductor elements are mounted on the multi-layer board. An insulating sealing member is provided on the multi-layer board and is covering the plurality of semiconductor elements. A metal film is provided on the insulating sealing member. An in-groove metal is provided in contact with a plurality of grooves extending from a side-surface upper end of the insulating sealing member to a side-surface lower end of the multi-layer board. An in-hole metal is provided in an inner wall of a hole penetrating through the insulating sealing member and is extending to the multi-layer board. The in-hole metal is contacting with the metal film and the grounding pattern.

9 Claims, 7 Drawing Sheets

(51) Int. Cl.
*H01L 23/13* (2006.01)
*H01L 23/31* (2006.01)
*H01L 23/538* (2006.01)
*H01L 23/552* (2006.01)
*H01L 25/00* (2006.01)
*H01L 25/065* (2023.01)

(52) U.S. Cl.
CPC ...... *H01L 23/3121* (2013.01); *H01L 23/5383* (2013.01); *H01L 24/48* (2013.01); *H01L 25/0655* (2013.01); *H01L 25/50* (2013.01); *H01L 2224/48227* (2013.01); *H01L 2924/15162* (2013.01); *H01L 2924/1517* (2013.01); *H01L 2924/1815* (2013.01)

SEMICONDUCTOR DEVICE AND METHOD FOR MANUFACTURING SEMICONDUCTOR DEVICE

FIELD

The present disclosure relates to a semiconductor device and a method for manufacturing the semiconductor device.

BACKGROUND

For example, in a semiconductor device configured to operate in a high frequency band, it is effective to use a package structure covered by a conductive shield film or the like to reduce interference and the like due to unnecessary electric wave radiation from a package, along with size reduction and highly dense integration. For example, it is concerned that cavity resonance or interference between semiconductors due to electromagnetic shielding is likely to occur in a package along with size reduction of a semiconductor package product as well as performance improvement of semiconductor elements mounted in the package.

PTL 1 discloses a high-frequency integrated circuit device in which an insulating resin is formed on a substrate on which a plurality of high-frequency elements are mounted, a separation groove is provided, from an upper surface, at each part of the insulating resin between the high-frequency elements, and a metal thin film is formed on the upper surface including the separation grooves and on a side surface.

CITATION LIST

Patent Literature

[PTL 1] JP 2005-340656 A

SUMMARY

Technical Problem

In a structure of PTL 1, an electromagnetic shield layer is formed after package dicing, and thus a shield film formation process is needed for each diced package. In this case, variance potentially occurs in the thickness of the electromagnetic shield layer among package products.

The present disclosure is intended to solve the above-described problem and provide a semiconductor device and a method for manufacturing the semiconductor device, which are preferable for production of a quality-improved semiconductor device having an electromagnetic shield function.

A semiconductor device according to the present disclosure, comprises: a multi-layer board which a wiring pattern and a grounding pattern are formed; a plurality of semiconductor elements mounted on the multi-layer board; an insulating sealing member provided on the multi-layer board and covering the plurality of semiconductor elements; a metal film provided on the insulating sealing member; in-groove metal provided in contact with a plurality of grooves extending from a side-surface upper end of the insulating sealing member to a side-surface lower end of the multi-layer board; and in-hole metal provided in an inner wall of a hole penetrating through the insulating sealing member and extending to the multi-layer board, the in-hole metal contacting with the metal film and the grounding pattern.

A method for manufacturing a semiconductor device according to the present disclosure, comprises: mounting a plurality of semiconductor elements on a multi-layer board including a wiring pattern and a grounding pattern; forming an insulating sealing member on the multi-layer board, the insulating sealing member covering the plurality of semiconductor elements; forming a plurality of separation through-holes through the insulating sealing member and the multi-layer board and surrounding the plurality of semiconductor elements in plan view; forming a hole at a position surrounded by the plurality of separation through-holes in plan view, the hole penetrating through the insulating sealing member and extending to the multi-layer board; forming a metal film on the insulating sealing member, a metal part provided in each of the plurality of separation through-holes and contacting with the metal film and the grounding pattern, and in-hole metal provided on an inner wall of the hole, the in-hole metal being in contact with the metal film and the grounding pattern; and splitting the multi-layer board and the insulating sealing member along the plurality of separation through-holes to perform dicing into the semiconductor device.

Other features of the present disclosure are clarified below.

Advantageous Effects of Invention

According to the present disclosure, electromagnetic shield and metal for reducing in-cavity resonance and inter-element interference are formed before dicing of the semiconductor device. Therefore, a semiconductor device and a method for manufacturing the semiconductor device that are preferable for quality improvement can be provided.

DESCRIPTION OF EMBODIMENTS

A semiconductor device and a method for manufacturing the semiconductor device according to each embodiment of the present disclosure will be described below with reference to the accompanying drawings. Same or corresponding

First Embodiment

Figure 1:
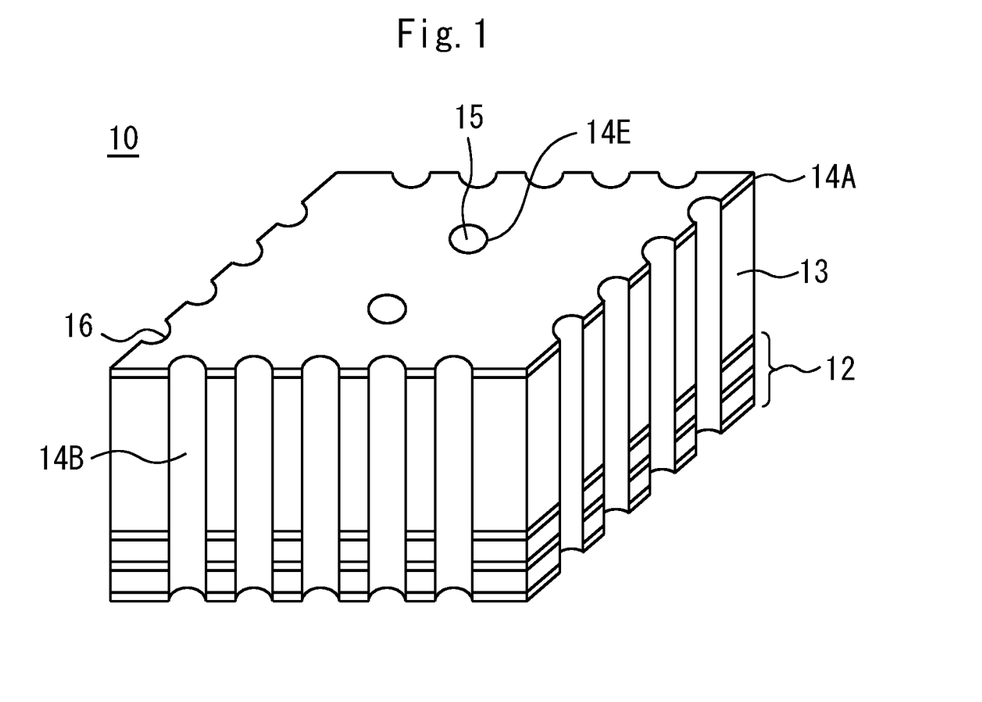
FIG. 1 is a perspective view of a semiconductor device according to a first embodiment.

FIG. 1 is a perspective view of a semiconductor device according to a first embodiment. A semiconductor device 10 includes a multi-layer board 12 which a wiring pattern and a grounding pattern are formed. The wiring pattern or the grounding pattern is formed on the front surface, on the back surface, and inside of the multi-layer board 12. The multi-layer board 12 may be, for example, a ceramic substrate or a glass epoxy substrate.

A plurality of semiconductor elements are mounted on the multi-layer board 12. In an example, the plurality of semiconductor elements are semiconductor chips. An insulating sealing member 13 that covers the plurality of semiconductor elements is provided on the multi-layer board 12. The insulating sealing member 13 is, for example, molding resin. A metal film 14A is provided on the insulating sealing member 13.

A plurality of grooves 16 extending from the upper end of the insulating sealing member 13 to the lower end of the multi-layer board 12 are formed at the side surface of the insulating sealing member 13 and the side surface of the multi-layer board 12. As a result, the side surface of the insulating sealing member 13 and the side surface of the multi-layer board 12 include the plurality of grooves 16 and flat surfaces positioned between the grooves 16. In-groove metal 14B is provided in the plurality of grooves 16. Since the in-groove metal 14B is formed in the grooves 16, the in-groove metal 14B extends from the side-surface upper end of the insulating sealing member 13 to the side-surface lower end of the multi-layer board 12. Thus, the in-groove metal 14B and the insulating sealing member 13 are exposed on the side surface of the semiconductor device 10. The in-groove metal 14B contacts with the metal film 14A and the grounding pattern of the multi-layer board 12.

A hole 15 penetrating through the insulating sealing member 13 and extending to the multi-layer board 12 is formed in the semiconductor device 10. The hole 15 may penetrate through the multi-layer board 12 or may be formed up to halfway through the multi-layer board 12 and not penetrate through the multi-layer board 12. In-hole metal 14E is formed on the inner wall of the hole 15. The in-hole metal 14E contacts with the metal film 14A and the grounding pattern of the multi-layer board 12.

For example, low-resistance metal such as gold or nickel may be used as materials of the metal film 14A, the in-groove metal 14B, and the in-hole metal 14E.

Figure 2:
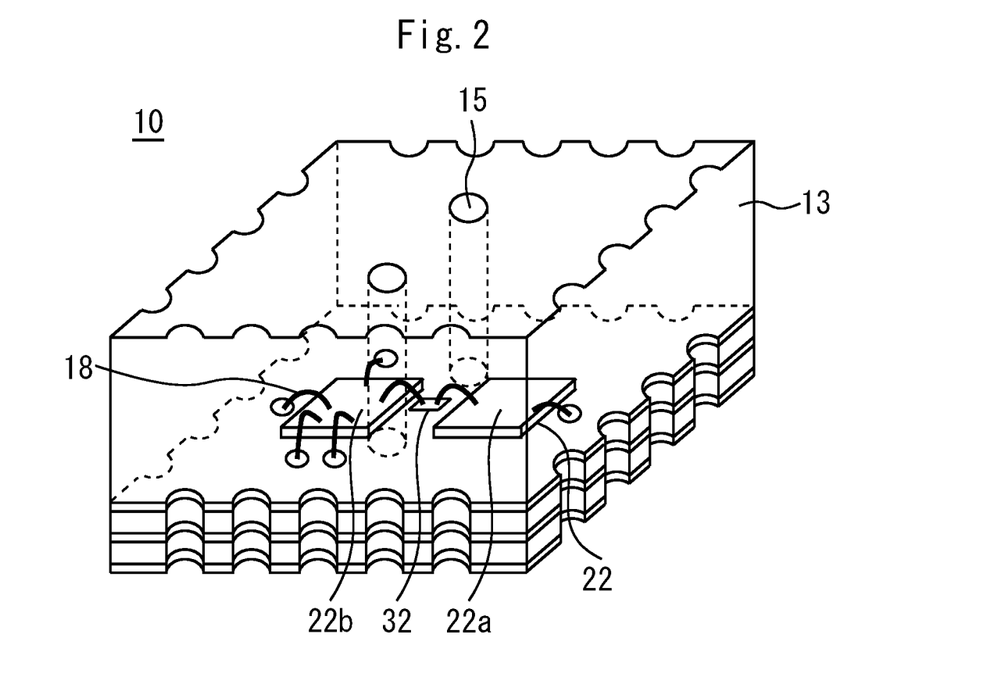
FIG. 2 is a perspective view of the semiconductor device whose inside is visualized.

FIG. 2 is a perspective view illustrating an internal structure of the semiconductor device 10 in FIG. 1. In FIG. 2, the metal film 14A, the in-groove metal 14B, and the in-hole metal 14E, which are illustrated in FIG. 1, are omitted and only the profile of the insulating sealing member 13 is illustrated, and accordingly, the inside of the semiconductor device is visualized. A plurality of semiconductor elements 22 are mounted on the multi-layer board 12. In an example, the plurality of semiconductor elements 22 include a first semiconductor element 22a and a second semiconductor element 22b. In another example, three or more semiconductor elements may be mounted on the multi-layer board 12.

The multi-layer board 12 includes a wiring pattern 32 on the upper surface side. A wire 18 connects each of the plurality of semiconductor elements 22 and the wiring pattern 32 of the multi-layer board 12.

Figure 3:
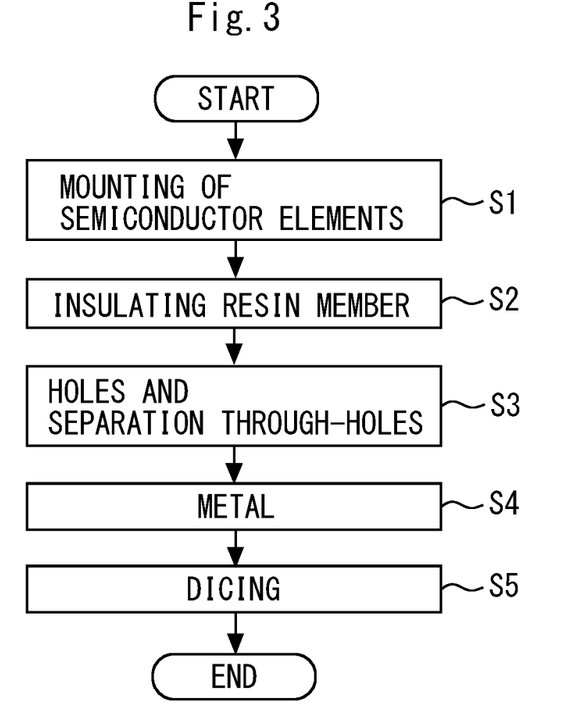
FIG. 3 is a flowchart.
Figure 4:
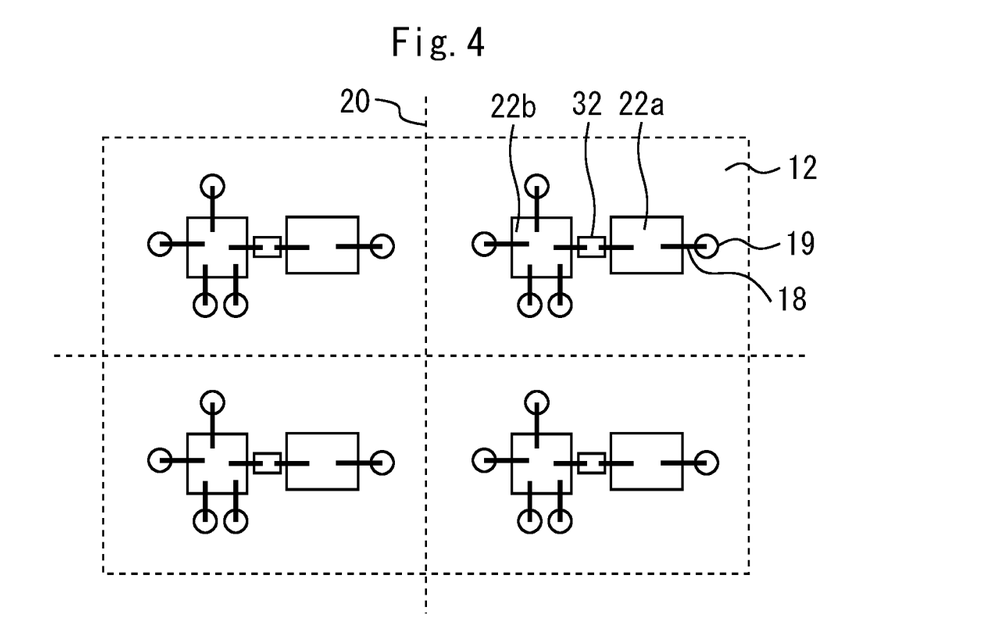
FIG. 4 is a view illustrating mount of semiconductor elements.

FIG. 3 is a flowchart illustrating a method for manufacturing the semiconductor device according to the first embodiment. The method for manufacturing the semiconductor device will be described below with reference to the flowchart. First at step S1, the plurality of semiconductor elements are mounted on the multi-layer board. FIG. 4 is a plan view of the multi-layer board on which the semiconductor elements are mounted. The first semiconductor element 22a and the second semiconductor element 22b are mounted on the multi-layer board 12. The first semiconductor element 22a and the second semiconductor element 22b are each connected to the wiring pattern 32 or a connection terminal 19 through the wire 18. The connection terminal 19 is a pattern through which input-output electric power of the semiconductor device is transferred.

In FIG. 4, a separation position 20 is illustrated with a dashed line. The separation position 20 is a virtual line that is to be used as a division position when the multi-layer board is divided and diced into semiconductor devices. FIG. 4 illustrates four semiconductor devices yet to be divided.

Then, the process advances to step S2. At step S2, the insulating sealing member 13 that covers the plurality of semiconductor elements 22 and the wire 18 is formed on the multi-layer board 12. In an example, the insulating sealing member 13 is formed on the entire upper surface of the multi-layer board 12.

Figure 5:
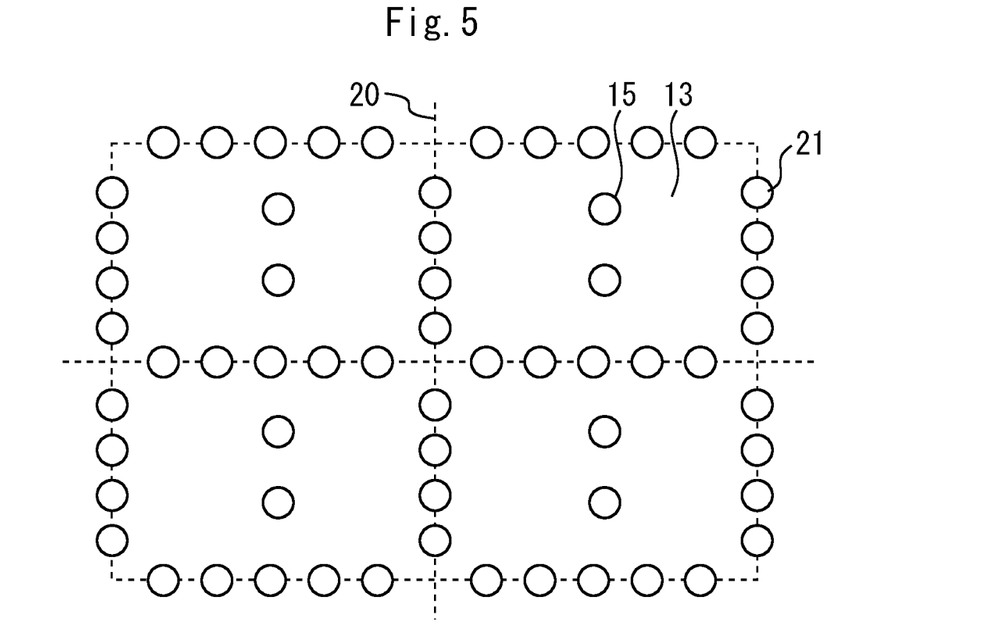
FIG. 5 is a view illustrating formation of holes and separation through-holes.

Then, the process advances to step S3. At step S3, a plurality of separation through-holes 21 and the holes 15 are formed. FIG. 5 is a plan view of the semiconductor device in which the separation through-holes 21 and the holes 15 are formed. The plurality of separation through-holes 21 are formed along the separation position 20. The plurality of separation through-holes 21 are formed to surround a plurality of semiconductor elements in plan view. The plurality of separation through-holes 21 penetrate through the insulating sealing member 13 and the multi-layer board 12.

Each hole 15 is formed at a position surrounded by the plurality of separation through-holes 21 in plan view. One hole 15 or a plurality of holes 15 may be formed in a region surrounded by the plurality of separation through-holes 21 that are formed in an annular shape. In the example illustrated in FIG. 5, two holes 15 are formed in the region surrounded by the plurality of separation through-holes 21 that are formed in an annular shape. Each hole 15 penetrates through the insulating sealing member 13 and extends to the multi-layer board 12. In this example, the hole 15 penetrates through the insulating sealing member 13 and the multi-layer board 12.

Figure 6:
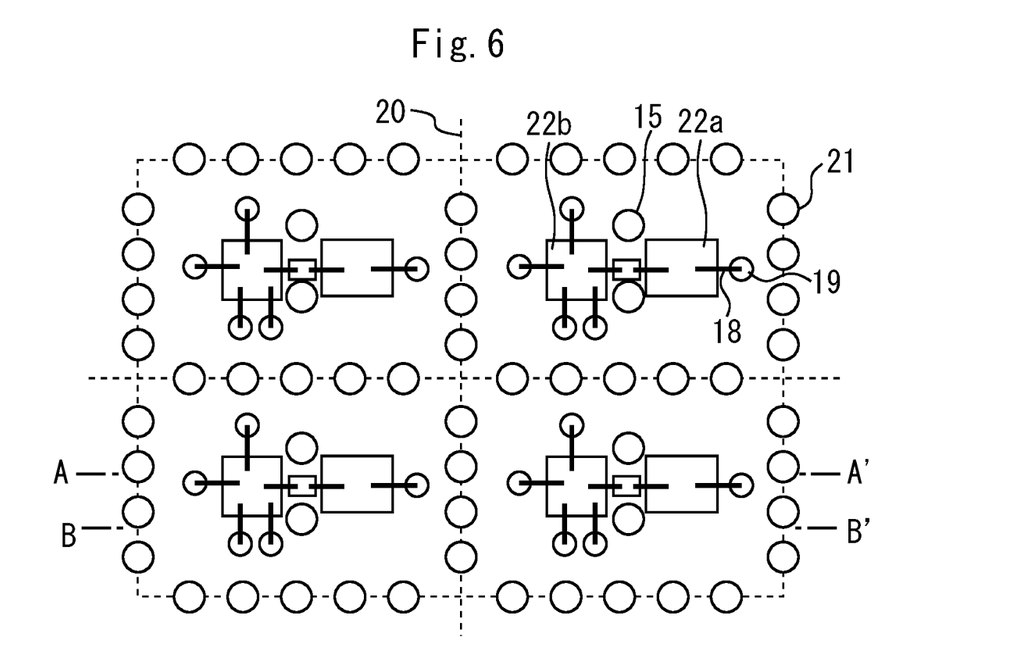
FIG. 6 is a diagram that visualizes the inside of FIG. 5.

FIG. 6 is a diagram in which the insulating sealing member 13 in FIG. 5 is transparent. At least part of each hole 15 is positioned between the plurality of semiconductor elements in plan view. In this example, two holes 15 are provided between the first semiconductor element 22a and the second semiconductor element 22b. In another example, each hole 15 may be formed at an optional position surrounded by the separation through-holes 21 that are formed in an annular shape.

A mechanical method, laser fabrication, or molding may be used as a method for forming the holes 15 and separation through-holes 21. In an example, the diameter of each separation through-hole 21 and the diameter of each hole 15 may be equal. In this case, the diameters of all separation through-holes 21 and all holes 15 are equal. Thus, all separation through-holes 21 and all holes 15 can be formed with one fabrication tool when the mechanical method or the molding is employed, and all separation through-holes 21 and all holes 15 can be collectively formed through a single process when the laser fabrication is employed.

Figure 7:
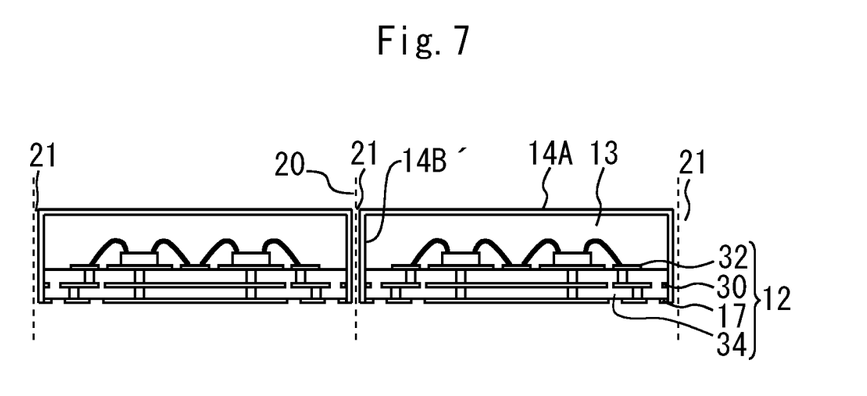
FIG. 7 is a cross-sectional view of the semiconductor device before dicing.
Figure 8:
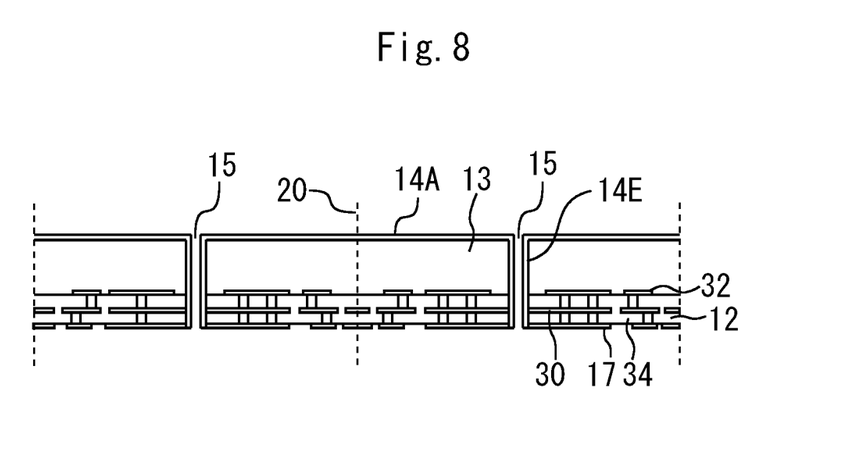
FIG. 8 is a cross-sectional view of the semiconductor device before dicing.

Then, the process advances to step S4. At step S4, metal is formed at the upper surface of the insulating sealing member 13, the inside of each separation through-hole 21, and the inside each hole 15. FIGS. 7 and 8 are each a cross-sectional view illustrating an exemplary semiconductor device after the metal formation. FIG. 7 is a cross-sectional view of the semiconductor device at a position where separation through-holes 21 are included. The cross-sectional view in FIG. 7 is taken at a position corresponding to line A-A' in FIG. 6. The multi-layer board 12 in the example illustrated in FIG. 7 includes an insulating layer 34, the wiring pattern 32, a back-surface grounding pattern 17, and an interior grounding pattern 30. In this example, the back-surface grounding pattern 17 that is exposed on the back surface of the multi-layer board 12 and the interior grounding pattern 30 that is provided inside the multi-layer board 12 are provided as grounding patterns. In another example, three or more grounding patterns may be provided at different levels of the multi-layer board.

FIG. 7 illustrates the metal film 14A on the insulating sealing member 13 and a metal part 14B' provided inside each separation through-hole 21. The metal part 14B' contacts with the metal film 14A, the back-surface grounding pattern 17, and the interior grounding pattern 30.

FIG. 8 is a cross-sectional view of the semiconductor device at a position where holes 15 are included. The cross-sectional view in FIG. 8 is taken at a position corresponding to line B-B' in FIG. 6. The in-hole metal 14E is formed on the inner wall of each hole 15. The hole 15 penetrates through the insulating sealing member 13 and the multi-layer board 12. The in-hole metal 14E contacts with the metal film 14A, the back-surface grounding pattern 17, and the interior grounding pattern 30.

The metal film 14A, the metal part 14B', and the in-hole metal 14E may be collectively formed by, for example, an evaporation coating or plating method. Such collective formation contributes to process simplification.

Then, the process advances to step S5. At step S5, dicing into semiconductor devices is performed by splitting the multi-layer board 12 and the insulating sealing member 13 along the plurality of separation through-holes 21. The separation through-holes 21 become the grooves 16 illustrated in FIG. 1 through the dicing. Accordingly, the metal part 14B' formed on the inner wall of each separation through-hole 21 becomes the in-groove metal 14B illustrated in FIG. 1. The semiconductor device illustrated in FIGS. 1 and 2 is completed through this dicing processing.

The in-groove metal 14B functions as an electromagnetic shield of the semiconductor device. The interval of the in-groove metal 14B contributes to performance of the electromagnetic shield. To ensure the electromagnetic shield performance of the semiconductor device 10, the interval of the separation through-holes 21 may be equal to or shorter than ¼ wavelength in a high frequency band in which the semiconductor device 10 operates.

For example, harmonic electric power of second order harmonic, third order harmonic, and n-th order harmonic (n is an integer) occurs from the semiconductor elements 22 in some cases. Thus, the interval of the in-groove metal 14B may be determined to shield not only fundamental electric power but also harmonic electric power. The ¼ wavelength is 4 mm, for example, when a molding material having a specific dielectric constant Er equal to five is used as the insulating sealing member 13 and the operation band of the semiconductor device is 10 GHz. The plurality of grooves 16 may have an interval of 0.6 mm to 1 mm between two adjacent grooves to increase harmonic-electric-power shield performance. In this case, the interval of the in-groove metal 14B is 0.6 mm to 1 mm, as well. Note that, when the accuracy of fabrication of the separation through-holes 21 is substantially 0.3 mm, the position of a groove 16 shifts from a predetermined position by 0.3 mm at maximum, and the position of another groove 16 adjacent to the groove shifts from a predetermined position by 0.3 mm at maximum, as well. Thus, it is possible to avoid connection of two grooves and reduce the groove interval by setting the interval of the plurality of grooves 16 to be 0.6 mm to 1 mm as described above. It is possible to increase harmonic-electric-power shield performance by reducing the interval of the in-groove metal 14B.

The grounding patterns are provided at optional positions as described above but may be formed at, for example, the front surface, back surface, and inside of the multi-layer board 12. Since the grounding patterns are exposed on the inner wall of each separation through-hole 21, it is possible to easily connect the metal part 143 and the grounding patterns only by forming the metal part 143 inside the separation through-hole 21.

In the method for manufacturing the semiconductor device described above, the metal film 14A, the metal part 14B', and the in-hole metal 14E are formed before the semiconductor device is separated as an individual piece, and thus the method is more preferable for manufacturing cost reduction due to reduction of the number of processes and for reduction of variance among electromagnetic shield films than a method in which the metal film 14A, the metal part 14B', and the in-hole metal 14E are formed after dicing into semiconductor devices.

The in-hole metal 14E is provided to reduce malfunction of the semiconductor device 10 due to in-cavity resonance. Interference between semiconductor elements can be reduced by positioning each hole 15 between semiconductor chips 6 in plan view. In other words, interference between semiconductor elements is reduced by positioning at least part of the in-hole metal 14E between the first semiconductor element 22a and the second semiconductor element 22b in plan view. In another example, each hole 15 may be provided at an optional position. The number of holes 15 is not particularly limited. When a plurality of holes 15 are formed, contact between two holes 15 needs to be avoided with taken into account the accuracy of fabrication of the holes 15. Fabrication variance among the holes 15 is, for example, 0.1 mm. To reduce in-cavity resonance, the radius of each hole 15 may be increased or the number of holes 15 may be increased.

Figure 9:
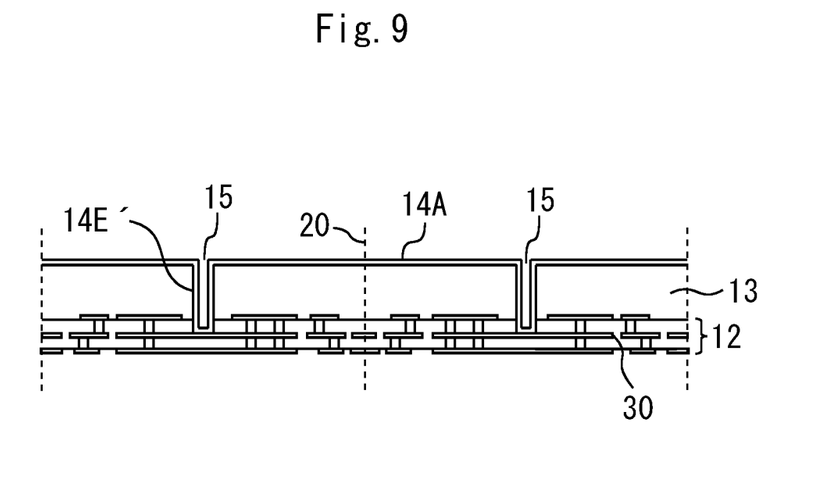
FIG. 9 is a cross-sectional view of a semiconductor device according to a modification.

FIG. 9 is a cross-sectional view of the semiconductor device, illustrating exemplary in-hole metal according to a modification. Each hole 15 illustrated in FIG. 9 penetrates through the insulating sealing member 13, extends up to halfway through the multi-layer board 12, and does not penetrate through the multi-layer board 12. The hole 15 is provided so that the interior grounding pattern 30 is exposed. In-hole metal 14E' is formed in the hole 15 to contact with the interior grounding pattern 30. The in-hole metal 14E' also contacts with the metal film 14A. The in-hole metal 14E' reduces in-cavity resonance. Since the hole 15 does not penetrate through the multi-layer board 12, the strength of the semiconductor device 10 is increased as compared to a configuration in which the hole 15 penetrates through the multi-layer board 12.

The modification described in the first embodiment, a correction example, or an alternative idea is applicable to a semiconductor device and a method for manufacturing the semiconductor device according to an embodiment below. Difference from the first embodiment will be mainly described for the semiconductor device and the method for manufacturing the semiconductor device according to the embodiment below.

Second Embodiment

Figure 10:
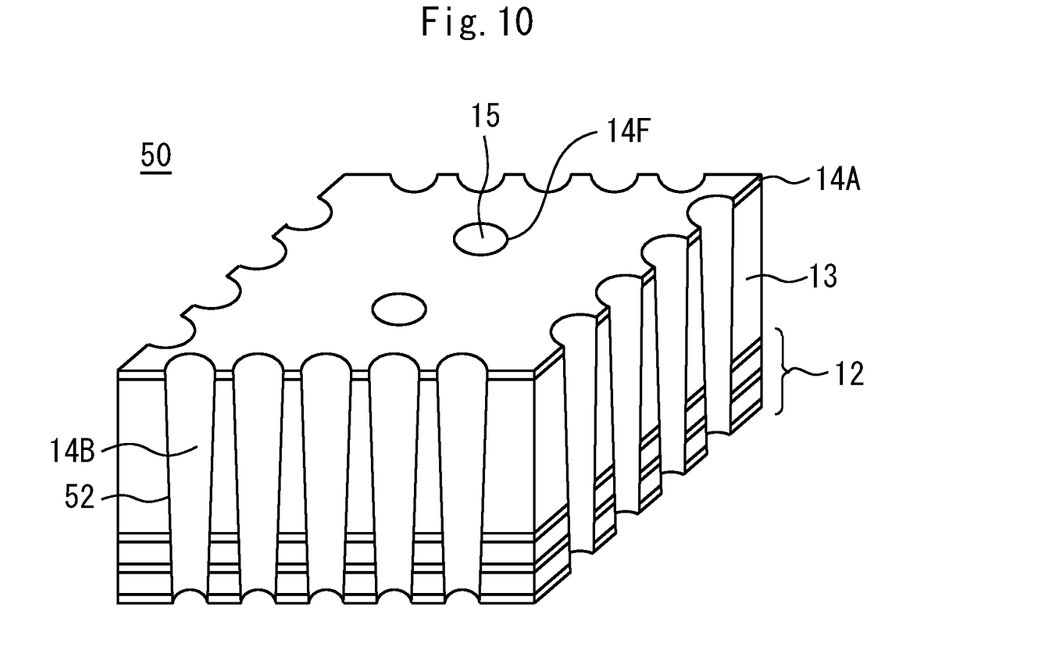
FIG. 10 is a perspective view of a semiconductor device according to a second embodiment.

FIG. 10 is a perspective view of a semiconductor device 50 according to a second embodiment. A plurality of grooves 52 have a width that decreases in a direction from the upper surface of the insulating sealing member 13 to the lower surface of the multi-layer board 12. In other words, each groove 52 has a shape that is tapered in the downward direction. Each hole 15 has a taper shape with a diameter that decreases in the direction from the upper surface of the insulating sealing member 13 to the lower surface of the multi-layer board 12. In-hole metal 14F is formed on the inner wall of the hole 15.

Figure 11:
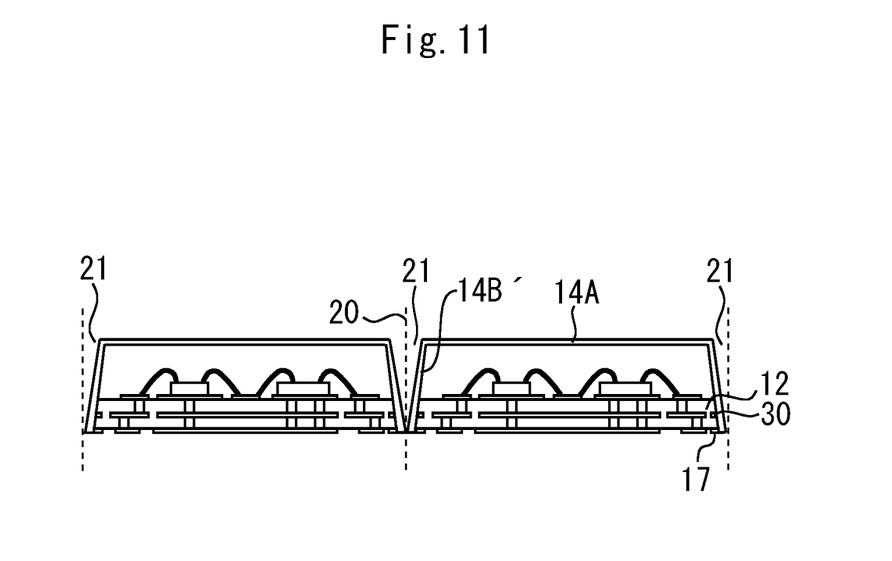
FIG. 11 is a cross-sectional view of the semiconductor device before dicing.

FIG. 11 is a cross-sectional view of the separation through-holes 21. The separation through-holes 21 are formed in circular cone shapes along the separation position 20. The separation through-holes 21 are each a hole with a diameter that gradually decreases from the upper surface of the semiconductor device to the lower surface thereof. In this example, each separation through-hole 21 penetrates through the multi-layer board 12. The metal part 14B' formed on the inner wall of the separation through-hole 21 is connected to the metal film 14A, the back-surface grounding pattern 17, and the interior grounding pattern 30.

Figure 12:
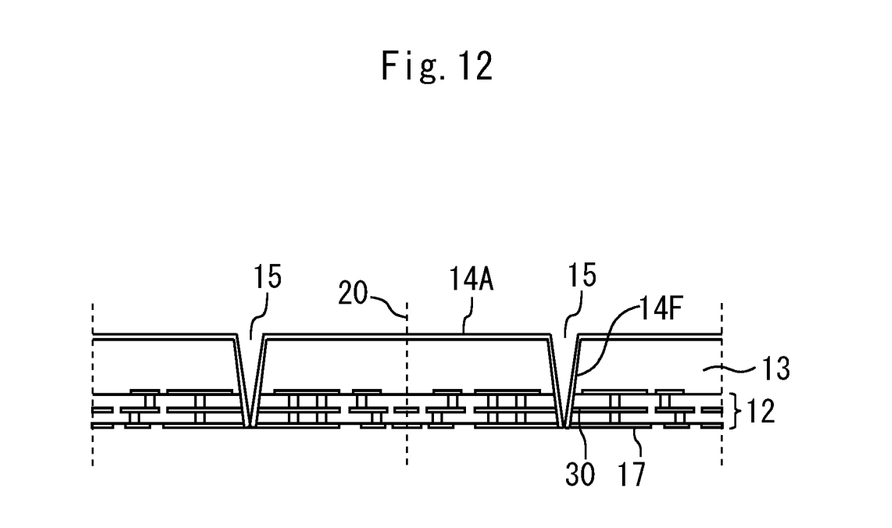
FIG. 12 is a cross-sectional view of the semiconductor device before dicing.

FIG. 12 is a cross-sectional view of the holes 15. Similarly to the separation through-holes 21, the holes 15 are each a hole with a diameter that gradually decreases from the upper surface of the semiconductor device to the lower surface thereof. The in-hole metal 14F is connected to the metal film 14A, the back-surface grounding pattern 17, and the interior grounding pattern 30.

As exemplarily illustrated in FIGS. 11 and 12, the plurality of separation through-holes 21 and holes 15 each have a taper shape with a diameter that decreases in the direction from the upper surface of the insulating sealing member 13 to the lower surface of the multi-layer board 12.

The separation through-holes 21 and the holes 15 with such taper shapes facilitate thickness increase of the metal part 14B' and the in-hole metal 14F at and near lowermost parts of the separation through-holes 21 and the holes 15. For example, the thicknesses of lower end parts and nearby parts of the metal part 143 and the in-hole metal 14F can be easily increased through formation by the evaporation coating method. The thickness increase of the metal part 143 and the in-hole metal 14F ensures their contact with the grounding patterns, and thus electromagnetic shield performance and cavity resonance suppression can be ensured irrespective of process variance.

Figure 13:
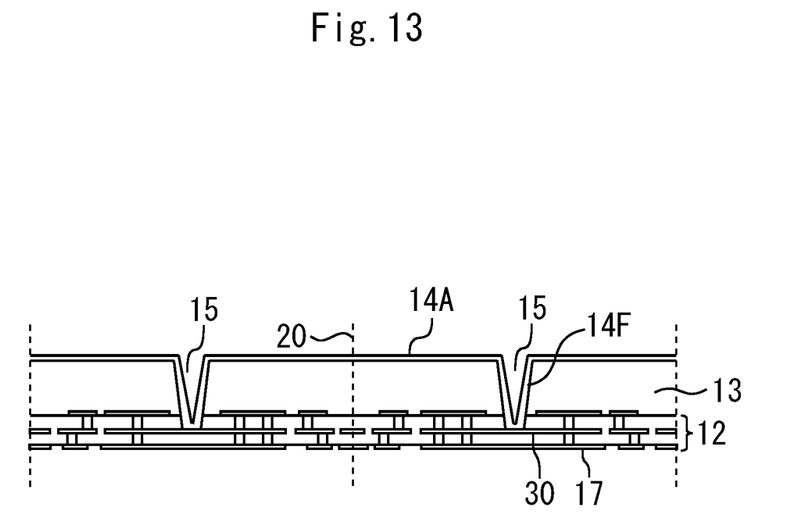
FIG. 13 is a cross-sectional view of a semiconductor device according to a modification.

FIG. 13 is a cross-sectional view of the in-hole metal 14F according to a modification. When each hole 15 extends halfway through the multi-layer board 12 and does not penetrate through the multi-layer board 12, the in-hole metal 14F and the interior grounding pattern 30 can be made contact with each other. Since the hole 15 does not penetrate through the multi-layer board 12, the strength of the semiconductor device is increased as compared to a configuration in which the hole 15 penetrates through the multi-layer board 12.

The shape, depth, and arrangement of each of the separation through-holes 21 and the holes 15 in the first and second embodiments and their modifications may be changed in accordance with usage of the semiconductor device.

REFERENCE SIGNS LIST 10 semiconductor device, 12 multi-layer board, 13 insulating sealing member, 14A metal film, 14B in-groove metal, 143 metal part, 14E,14F in-hole metal, 15 hole, 17 back-surface grounding pattern, 21 separation through-hole, 30 interior grounding pattern

The invention claimed is:

1. A semiconductor device comprising:
a multi-layer board which a wiring pattern and a grounding pattern are formed;
a plurality of semiconductor elements mounted on the multi-layer board;
an insulating sealing member provided on the multi-layer board and covering the plurality of semiconductor elements;
a metal film provided on the insulating sealing member;
in-groove metal provided in contact with a plurality of grooves extending from a side-surface upper end of the insulating sealing member to a side-surface lower end of the multi-layer board; and
in-hole metal provided in an inner wall of a hole penetrating through the insulating sealing member and extending to the multi-layer board, the in-hole metal contacting with the metal film and the grounding pattern.

2. The semiconductor device according to claim 1, wherein
the grounding pattern includes a back-surface grounding pattern exposed on a back surface of the multi-layer board,
the hole penetrates through the insulating sealing member and the multi-layer board, and
the in-hole metal contacts with the back-surface grounding pattern.

3. The semiconductor device according to claim 1, wherein
the grounding pattern includes an interior grounding pattern provided inside the multi-layer board,
the hole penetrates through the insulating sealing member, extends up to halfway through the multi-layer board, and does not penetrate through the multi-layer board, and
the in-hole metal contacts with the interior grounding pattern.

4. The semiconductor device according to claim 1, further comprising a wire connecting the plurality of semiconductor elements and the wiring pattern.

5. The semiconductor device according to claim 1, wherein the plurality of grooves each have a width that decreases in a direction from an upper surface of the insulating sealing member to a lower surface of the multi-layer board.

6. The semiconductor device according to claim 1, wherein the hole has a taper shape with a diameter that decreases in a direction from an upper surface of the insulating sealing member to a lower surface of the multi-layer board.

7. The semiconductor device according to claim 1, wherein the plurality of grooves have an interval of 0.6 mm to 1 mm between two adjacent grooves.

8. The semiconductor device according to claim 1, wherein
   the plurality of semiconductor elements include a first semiconductor element and a second semiconductor element, and
   at least part of the in-hole metal is positioned between the first semiconductor element and the second semiconductor element in plan view.

9. The semiconductor device according to claim 1, wherein the hole and the in-hole metal are provided in plurality.

\* \* \* \* \*